United States Patent [19]

Willis

[11] Patent Number: 4,630,294
[45] Date of Patent: Dec. 16, 1986

[54] DIGITAL SAMPLE RATE REDUCTION SYSTEM

[75] Inventor: Donald H. Willis, Indianapolis, Ind.

[73] Assignee: RCA Corporation, Princeton, N.J.

[21] Appl. No.: 755,759

[22] Filed: Jul. 17, 1985

[51] Int. Cl.$^4$ ............................................. H03K 21/00
[52] U.S. Cl. ........................................ 377/48; 377/64
[58] Field of Search ..................... 377/108, 47, 48, 64; 307/271; 328/14, 60, 61, 139; 358/13, 133

[56] References Cited

U.S. PATENT DOCUMENTS

| 3,446,947 | 5/1969 | Overstreet, Jr. | 377/48 |
| 3,697,682 | 10/1972 | Berg | 358/133 |
| 3,982,063 | 9/1976 | Brown et al. | |
| 4,086,471 | 4/1978 | Takahashi | 377/47 |
| 4,106,053 | 8/1978 | Maxemchuk | 358/13 |
| 4,306,249 | 12/1981 | Croll | 358/133 |
| 4,318,046 | 3/1982 | Sonntag | |
| 4,377,821 | 3/1983 | Sautter et al. | 358/133 |
| 4,423,381 | 12/1983 | Stepp et al. | 377/48 |
| 4,468,708 | 8/1984 | Coleman, Jr. | 358/133 |

Primary Examiner—John S. Heyman
Assistant Examiner—K. Ohralik
Attorney, Agent, or Firm—Paul J. Rasmussen; Eric P. Herrmann; Dilip A. Kulkarni

[57] ABSTRACT

A digital sample rate reduction apparatus receives an input signal occurring at a given sample rate and produces an output signal occurring at a rate which is two-thirds the input sample rate. One half of the output samples are interpolated samples and the other half are original input samples.

8 Claims, 8 Drawing Figures

DIGITAL SAMPLE RATE REDUCTION SYSTEM

This invention relates to an apparatus for reducing the sample rate of a digital sample stream from an original sample rate to a lower sample rate, that is two-thirds of the original sample rate.

BACKGROUND

In the field of television, considerable efforts have been directed toward digitizing the color video signal, processing the digitized samples of the video signal (a) to separate the chrominance and luminance components and (b) to demodulate the chrominance components into respective baseband signals, and then converting the digital samples back into respective analog signals for the application thereof to the television picture tube for reproduction. A motivation for these efforts comes from the fact that the digital television can offer a number of novel features—such as still picture display, multipicture displays, direct hookups to satellite dish amplifiers, etc. The digitization is typically achieved by sampling the analog video signal at a finite sampling rate, which must exceed a predetermined minimum sampling rate in order to keep the quality of reproduction within acceptable limits.

The minimum sampling rate must satisfy what is generally known as the Nyquist criterion, which requires that the sampling rate be at least twice the bandwidth of the analog signal of interest. In the NTSC format of the color television system, the desirable signal bandwidth is about 4.2 MHz, thereby requiring a sampling rate in excess of 8.4 MHz. If the sampling rate is higher than the minimum value given by the Nyquist criterion, then aliasing of the digital samples is avoided.

Because of the operational considerations, it is advantageous to sample the analog color video signal at some integral multiple of the frequency of the unmodulated color subcarrier, hereinafter referred to as Fsc (3.58 MHz). The sampling rate of 3 Fsc is the lowest integer multiple of the color subcarrier frequency that exceeds the Nyquist requirement. However, the 3 Fsc sampling rate poses certain operational disadvantages in the signal processing operations of the television receiver—such as the demodulation of the chrominance components into the respective baseband signals. It is, therefore, common practice to use a sampling rate that is four times the color subcarrier frequency (4 Fsc), although it results in a far greater sampling rate than is called for by the Nyquist criterion.

After the incoming color video signal is digitized and decoded into its respective baseband components—i.e., one luminance (Y) and two color difference signals (I and Q, for example), it may be desirable to store the digital samples in a field or frame memory for reasons such as progressive scanning, noise reduction, special effects, etc. At this stage, it is possible to reduce the size of the memory by reducing the sample rate of the stored data from 4 Fsc to something lower without violating the Nyquist criterion.

In accordance with this invention, the sample rate of the luminance signal is reduced from 4 Fsc (i.e., 14.32 MHz) to (8/3) Fsc (i.e., 9.55 MHz). The choice of two-thirds as the multiplier not only facilitates the sample rate reduction process, but is also fulfills the Nyquist requirement that the sample rate (8/3 Fsc or 9.55 MHz) exceed two-times the highest signal frequency (8.2 MHz) in the luminance band.

The sample rate reduction for each of the chrominance components (e.g., I and Q) may be greater (e.g., one-third or one-fourth or less of the original sample rate of 4 Fsc), since the desired bandwidths for the chrominance signals are much lower compared to the luminance signal (e.g., 1.5 and 0.5 MHz, respectively). To this end, suitable sample dropping or decimating circuits may be employed for reducing the sample rates of the chrominance components. The specific sample reduction circuits for the chrominance signals are not a part of this invention.

The sample rate reduction apparatus, pursuant to this invention, receives the input sample stream and generates an interleaved output sample stream in which half of the output samples are passed unaltered from the input sample stream and in which the other half of the output samples are interpolated from the original input samples, and which has a sample rate that is two-thirds of the input sample rate.

In one embodiment of this invention, the sample rate reduction apparatus includes a set of three latches connected together in series. The input sample stream is clocked through these latches in response to the accompanying 4 Fsc clock pulses, thereby sequentially making available to an interpolator successive sets of four input samples. The interpolator generates at the output thereof a stream of interpolated samples in response to the (8/6) Fsc clock pulses. A switch is alternately coupled to the interpolator output and the output of the second one of the three latches at the (8/6) Fsc rate to merge the streams of the interpolated and unaltered input samples. A fourth latch connected to the output of the switch and driven by the (8/3) Fsc clock pulses provides an output sample stream which has a sample rate that is two-thirds of the sample rate of the input sample stream, and in which one-half of the output samples are interpolated and the other half are unaltered input samples.

An advantage of the subject apparatus for generating an interleaved output stream is that the coefficients employed for estimating the interpolated samples do not change from cycle to cycle, since the relative position or timing of the interpolated samples remain fixed relative to the respective input samples.

IN THE DRAWINGS

DETAILED DESCRIPTION

Figure 1:
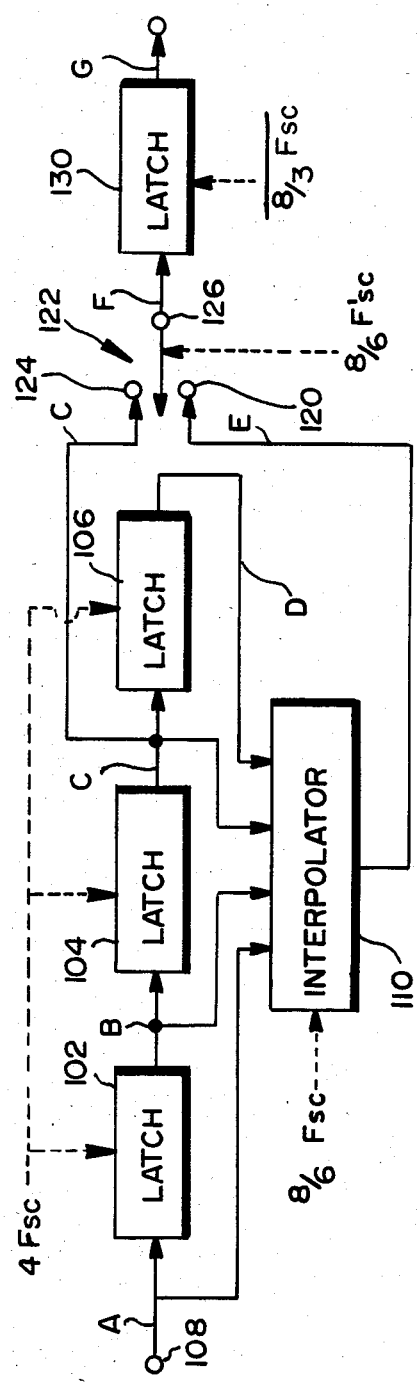
FIG. 1 shows a functional block diagram of a digital signal processing circuit employed for reducing the sample rate of an input sample stream from an original sample rate to a lower sample rate that is two-thirds of the original sample rate in accordance with the principles of the present invention.
Figure 5:
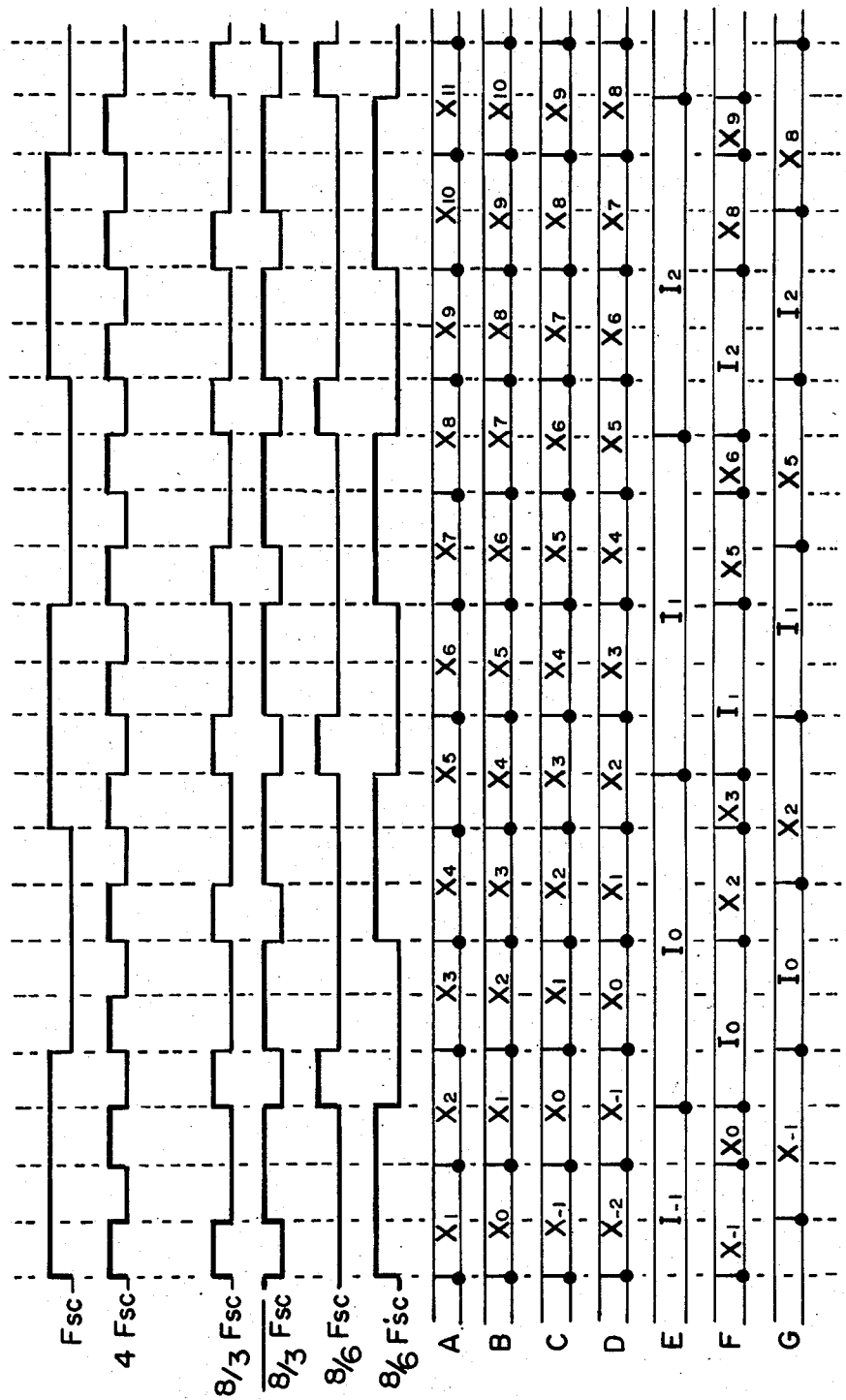
FIGS. 5–8 are pulse waveforms associated with the circuits of FIGS. 1–4 respectively.

FIG. 1 shows the subject digital sample rate reduction apparatus 100. FIG. 5 illustrates the associated waveforms. In respect of FIG. 1, it will be noted that the input and output samples are multibit binary samples of parallel bits (e.g., 8 bits), and that the interconnecting lines A–G, latches, etc., are all multibit parallel arrangements. In connection with FIG. 5, it will be noted that the Fsc and 4 Fsc clocks are system clocks in a 4 Fsc sampling system, and the invention circuitry develops the remaining clocks—(8/3) Fsc, $\overline{(8/3) \text{ Fsc}}$, (8/6) Fsc and (8/6) F'sc from the system clocks. The letter A in FIG. 5 indicates an input sample sequence in a 4 Fsc sampling system. The dots in the sample sequence A indicate the points at which the respective samples are taken. The sample values are, however, present on the line A in FIG. 1 for the entire 4 Fsc clock period. The interconnecting lines A–G in FIG. 1 correspond to the sequences A–G in FIG. 5. The instant sample rate reduction apparatus 100 produces an output sample sequence G having a sample rate which is two-thirds of the input sample rate of 4 Fsc.

The subject sample rate reduction apparatus 100 includes a set of three latches 102, 104 and 106 connected to each other in series. The input sample sequence occurring at the 4 Fsc rate, and available at an input terminal 108, is clocked through the latches 102, 104 and 106, acting as a three-stage shift register delay line, in response to the associated 4 Fsc clock pulses. The outputs of the latches 102, 104 and 106 on the associated lines B, C and D are respectively identified by the sequences B, C and D in FIG. 5. As the input sample sequence is clocked through the latches 102, 104 and 106, the successive sets of four input samples are made available, simultaneously, to a four input cubic interpolator 110 on lines A, B, C and D respectively.

The cubic interpolator 110 produces on the output line E a stream of interpolated samples, indicated by the letter E in FIG. 5, in accordance with an equation $$I = -(1/16)X_A + (9/16)X_B + (9/16)X_C - (1/16)X_D,$$

in response to a clock signal having pulses occurring at the (8/6) Fsc rate with a duty cycle of 16%. The (8/6) Fsc sample rate at the output of the interpolator 110 is one-half of the desired rate of the output sample sequence, which is (8/3) Fsc. Although a cubic interpolator is shown herein, any suitable interpolator design— e.g., a linear interpolator—may be used instead for computing the interpolated samples. The specific design of the interpolator 110 is not a part of the present invention. The output of the interpolator 110 is applied to one input terminal 120 of a switch (e.g., transistor or multiplexor) 122. The sample sequence appearing at the output of the second latch 104, and indicated by the letter C in FIG. 5, is supplied to a second input terminal 124 of the switch 122.

The switch 122 alternately couples the values on its two input terminals 120 and 124 to its output terminal 126 in response to a clock signal having pulses which occur at the (8/6) Fsc rate, but with a duty cycle of 50%—indicated as (8/6) F'sc in FIGS. 1 and 5. The sample values appearing at the output terminal 126 of the switch 124 are shown by the letter F in FIG. 5.

A latch 130 coupled to the output terminal 126 of the switch, and clocked by a clock signal $\overline{(8/3) \text{ Fsc}}$, generates an output sample sequence, indicated by the letter G in FIG. 5, in which one-half of the samples are interpolated samples and the other half are original input samples, and in which the samples occur at the rate of 8/3 Fsc (or two-thirds of 4 Fsc).

From FIG. 5, it will be noted that the interpolated sample $I_1$, produced at the rising edge of the (8/6) Fsc clock pulses, is computed from the input samples $X_2$, $X_3$, $X_4$ and $X_5$, with equal weighting of $X_2$ and $X_5$ and also of $X_3$ and $X_4$ such that $I_1$ has a value which is appropriate for a sample whose timing falls exactly half way between $X_2$ and $X_5$ (and also between $X_3$ and $X_4$) in the output sequence. Similarly, the interpolated sample $I_2$, triggered by the rising edge of the (8/6) Fsc clock pulses, is computed from the input samples $X_5$ through $X_8$ and has a value which is appropriate for a sample that falls half way between $X_5$ and $X_8$ (and also between $X_6$ and $X_7$) in the output sequence, and so on. As hereinbefore mentioned, the coefficients used for determining the interpolated values $I_1, I_2 \ldots$ do not change, since the relative timing of the interpolated values remain unchanged with respect to the associated input samples.

Figure 2:
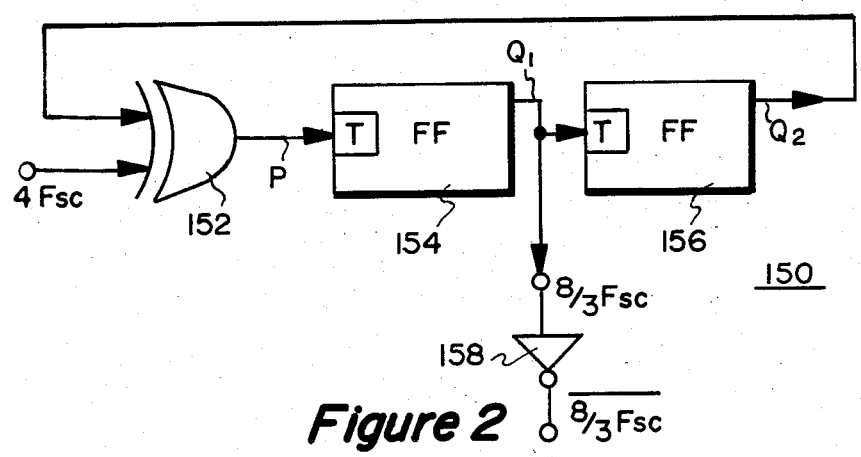
FIG. 2 is a circuit for converting a 4 Fsc clock pulse stream to a (8/3) Fsc clock pulse stream, and suitable for use with the FIG. 1 sample rate reduction circuit.
Figure 6:
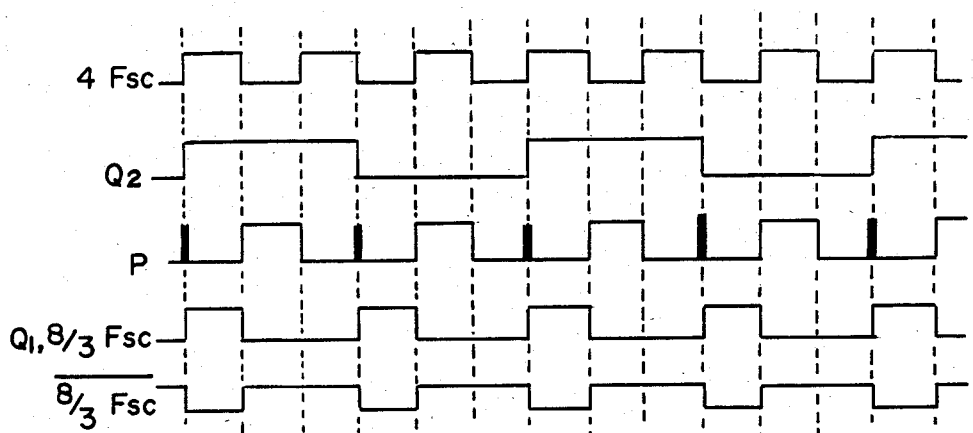

FIG. 2 depicts a circuit 150 used for generating the (8/3) Fsc clock pulses from a 4 Fsc clock signal. The accompanying waveforms are illustrated in FIG. 6. The FIG. 2 circuit includes a two-input exclusive OR gate 152 and a pair of toggle flip flops 154 and 156, connected together in series as shown. The 4 Fsc clock pulses are applied to one of the two inputs of the exclusive OR gate 152. The output of the second flip flop 156 is fed back to the other input of the exclusive OR gate 152. The 8/3 Fsc clock pulses are derived at the output of the first flip flop 154. An inverter 158 coupled to the output of the first flip flop 154 generates the $\overline{(8/3) \text{ Fsc}}$ clock pulses for the application to the latch 130.

Figure 3:
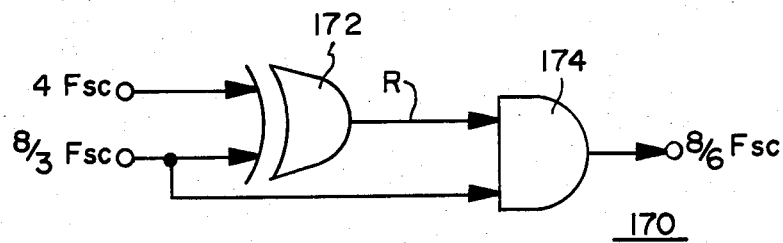
FIGS. 3 and 4 are circuits, suitable for use with the sample rate reduction circuit of FIG. 1, for generating clock signals occurring at an (8/6) Fsc rate.
Figure 7:
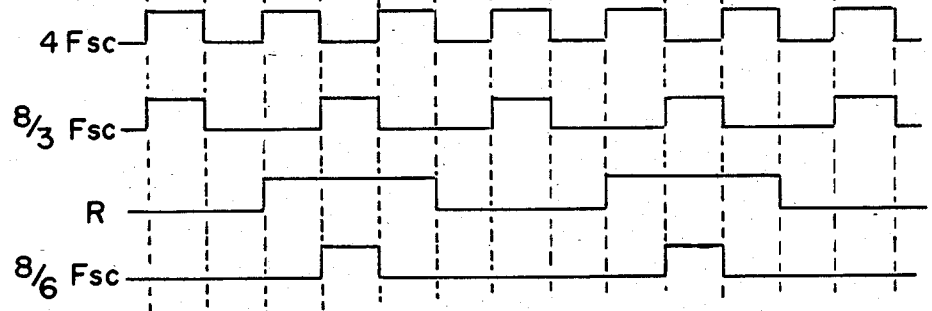

A circuit 170 for generating the (8/6) Fsc clock pulses is given in FIG. 3. The circuit 170 comprises an exclusive OR gate 172 and an AND gate 174 connected as illustrated in FIG. 3. The waveforms associated with the circuit of FIG. 3 are shown in FIG. 7. The 4 Fsc and (8/3) Fsc clock pulses are applied to the first and second inputs of the exclusive OR gate 172 respectively. The output of the exclusive OR gate 172 is applied to one of the inputs of the AND gate 174. The (8/3) Fsc clock pulses are applied to the other input of the AND gate 174. The (8/6) Fsc clock pulses, with a duty cycle of 16%, are produced at the output of the AND gate 174 for the application to the interpolator 110.

Figure 4:
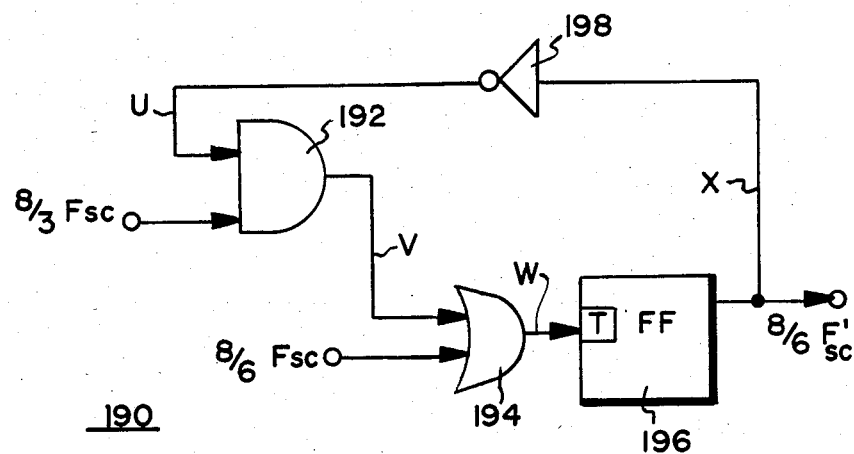
Figure 8:
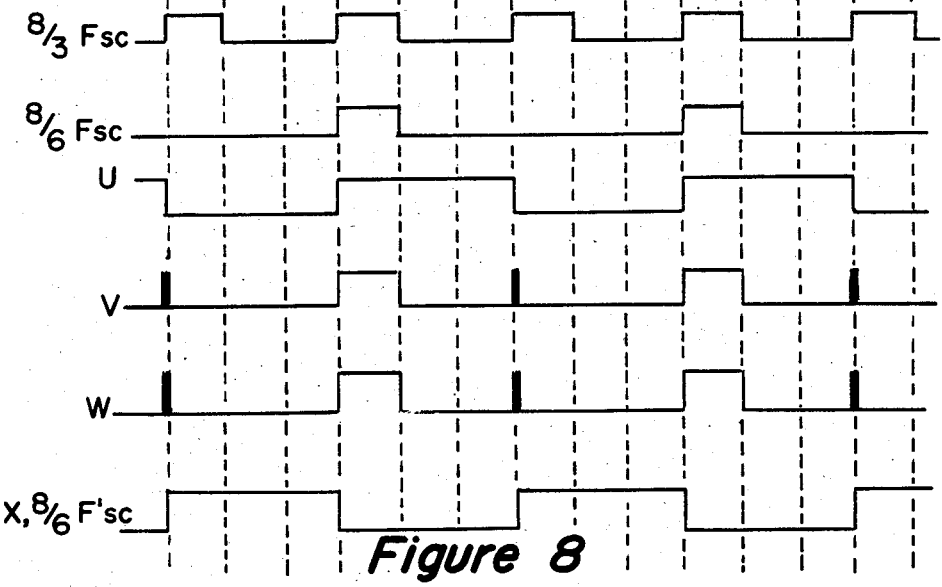

FIG. 4 shows a circuit 190 for generating a clock signal having pulses occurring at the rate of (8/6) Fsc and having a duty cycle of 50%. The corresponding waveforms are given in FIG. 8. The FIG. 4 circuit includes an AND gate 192, an OR gate 194 and a toggle flip flop 196, which are connected as shown. The (8/3) Fsc clock pulses are applied to one of the inputs of the AND gate 192. The output of the flip flop 196 is inverted by an inverter 198 and supplied to the other input of the AND gate 192. The output of the AND gate 192 is fed to the first input of the OR gate 194. The (8/6) Fsc clock pulses are applied to the second input of the OR gate 194. The output of the OR gate 194 is fed to the flip flop 196. The (8/6) F'sc clock pulses, with a duty cycle of 50%, are produced at the output of the flip flop 196 for the application to the switch 122.

Although specific circuits are shown for implementing the present invention, it will be noted that many variations are possible in the circuits described herein without exceeding the scope of the present invention as set forth in the claims. For example, fewer than three latches may be employed in the FIG. 1 circuit along with an interpolator with less than four inputs.

What is claimed is:

1. A digital sample rate reduction apparatus for converting an input sample sequence with a given sample rate to an output sample sequence occurring at a rate that is two-thirds of the input sample rate and in which one-half of the samples are interpolated samples and the remaining half are original input samples; said sample rate reduction apparatus comprising:

latching means through which said input sample sequence is clocked in response to the application of a first clock signal synchronous to and having the same rate as said input sample sequence;

means including an interpolating means coupled to said latching means and driven by a second clock signal occurring at one-third of said input sample rate, for producing at the output thereof a sequence of interpolated samples occurring at one-half of said output sample rate; and means including a switching means selectively coupled to said interpolating means and said latching means; said switching means being driven by a third clock signal occurring at one-third of said input sample rate for producing at the output thereof said output sample sequence occurring at two-thirds of said input sample rate, and in which one half of the samples are interpolated samples and the balance half are unaltered input samples.

2. The sample rate reduction apparatus as defined in claim 1 wherein said means including said switching means comprises:

a switch coupled to said first latching means and said interpolating means for selectively inserting said unaltered input samples into said sequence of interpolated samples in response to said third clock signal occurring at one-half of said output sample rate; and a latch coupled to said switch and driven by a fourth clock signal occurring at two-thirds of said input sample rate for generating said output sample sequence in which one-half of the samples are transmitted unaltered and the other half of the samples are interpolated.

3. The sample rate reduction apparatus as defined in claim 1 wherein said interpolating means has a set of four inputs; wherein said latching means comprises a set of three latches connected together in series and forming a three-stage shift register delay line; said input sample sequence being clocked through said set of three latches in response to the application of said first clock signal occurring at said input sample rate to sequentially make available to said interpolating means successive sets of four input samples for computing said interpolated samples.

4. The sample rate reduction apparatus as defined in claim 3 wherein said switching means derives said unaltered input samples from the output of the second one of said set of three latches.

5. The sample rate reduction apparatus as defined in claim 2 wherein said means including said switching means further includes means for converting said first clock signal occurring at said inpt sample rate to said fourth clock signal occurring at two-thirds of said input sample rate; said clock rate converting means comprising:

an exclusive OR gate having a pair of inputs; one of said inputs of said exclusive OR gate being supplied with said first clock signal;

a pair of flip flops connected in series; the output of said exclusive OR gate being applied to the input of the first one of said flip flops; the output of said first flip flop being supplied to the input of the second one of said flip flops; the output of said second flip flop being fed back to the other of said inputs of said exclusive OR gate; and means for inverting said output of said first flip flop for producing said fourth clock signal occurring at two-thirds of said input sample rate.

6. The sample rate reduction apparatus as defined in claim 5 wherein said means including said interpolating means further includes means for generating said second clock signal occurring at one-half of said output sample rate; said second clock signal generating means comprising:

a second exclusive OR gate having a pair of inputs; one of said inputs of said second exclusive OR gate being fed with said first clock signal occurring at said input sample rate; the other of said inputs of said second exclusive OR gate being supplied with said output of said first flip flop which is occurring at two-thirds of said input sample rate; and an AND gate having a pair of inputs; one of said inputs of said AND gate having applied to it said output of said first flip flop occurring at said two-thirds of said input sample rate; the other of said inputs of said AND gate being fed with the output of said second exclusive OR gate; said second clock signal at one-half of said output sample rate being drawn from the output of said AND gate.

7. The sample rate reduction apparatus as defined in claim 6 wherein said means including said switching means additionally includes further means for generating said third clock signal also occurring at one-half of said output sample rate; said third clock signal generating means comprising:

a second AND gate having a pair of inputs; one of said inputs of said second AND gate having applied to it said output of said first flip flop occurring at two-thirds of said input sample rate;

an OR gate having a pair of inputs; one of said inputs of said OR gate being fed with said second clock signal at said output of said first-mentioned AND gate; the other OR gate input being supplied with the output of said second AND gate; and a third flip flop having its input coupled to the output of said OR gate, and having its output inverted and fed back to the other input of said second AND gate; the output of said third flip flop providing said third clock signal occurring at one-half of said output sample rate.

8. A digital sample rate reduction apparatus as defined in claim 1 comprising:

an input port for applying an input sample sequence occurring at a given sample rate;

means for applying a clock signal synchronous to and having the same rate as said input sample sequence;

means coupled to said input port and responsive to said clock signal for simultaneously providing at least two samples from said input sample sequence;

means including an interpolating means responsive to said clock signal and said at least two samples for producing interpolated samples at a rate of one-third of said input sample rate, which interpolated samples approximate the signal values occurring between said at least two samples; and means including a switching means coupled to said interpolating means and said input port for selectively applying at an output thereof ones of said unaltered input samples and said interpolated samples to form an output sample sequence occurring at two-thirds of said input sample rate, and in which one-half of samples are interpolated and the balance half are unaltered input samples.

* * * * *